(12) United States Patent
Lin et al.

(10) Patent No.: US 11,107,990 B2
(45) Date of Patent: Aug. 31, 2021

(54) MASK SHEET AND METHOD FOR MANUFACTURING THE SAME

(71) Applicants: Ordos Yuansheng Optoelectronics Co., Ltd., Inner Mongolia (CN); BOE TECHNOLOGY GROUP CO., LTD., Beijing (CN)

(72) Inventors: Zhiming Lin, Beijing (CN); Chunchieh Huang, Beijing (CN); Jian Zhang, Beijing (CN); Bili Baiyin, Beijing (CN); Zhiyuan Hao, Beijing (CN); Xiaolin Xin, Beijing (CN); De Zhang, Beijing (CN); Xu Liu, Beijing (CN); Xinjian Zhang, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 310 days.

(21) Appl. No.: 16/329,625

(22) PCT Filed: Jun. 28, 2018

(86) PCT No.: PCT/CN2018/093329
§ 371 (c)(1),
(2) Date: Feb. 28, 2019

(87) PCT Pub. No.: WO2019/062232
PCT Pub. Date: Apr. 4, 2019

(65) Prior Publication Data
US 2021/0013414 A1 Jan. 14, 2021

(30) Foreign Application Priority Data
Sep. 27, 2017 (CN) .......................... 201710890369.8

(51) Int. Cl.
*C23C 14/04* (2006.01)
*H01L 51/00* (2006.01)
*H01L 51/56* (2006.01)

(52) U.S. Cl.
CPC ........ *H01L 51/0011* (2013.01); *C23C 14/042* (2013.01); *H01L 51/001* (2013.01); *H01L 51/56* (2013.01)

(58) Field of Classification Search
None
See application file for complete search history.

(56) References Cited

U.S. PATENT DOCUMENTS

| 2005/0211981 A1* | 9/2005 | Yotsuya | ............... C23C 14/042 |
| | | | 257/64 |
| 2015/0290667 A1* | 10/2015 | Mizumura | ............. B05B 12/20 |
| | | | 118/504 |
| 2016/0168691 A1* | 6/2016 | Takeda | ................... B23K 26/40 |
| | | | 118/504 |

FOREIGN PATENT DOCUMENTS

| CN | 102766841 A | 11/2012 |
| CN | 103938153 A | 7/2014 |

(Continued)

OTHER PUBLICATIONS

Chinese Office Action dated Jan. 30, 2019, from application No. 201710890369.8.

(Continued)

*Primary Examiner* — Karla A Moore
(74) *Attorney, Agent, or Firm* — Arch & Lake LLP

(57) ABSTRACT

The present disclosure relates to a mask sheet. The mask sheet includes a plurality of mask units. Each mask unit includes an evaporation effective area and a plurality of welding areas that are distributed around the evaporation effective area according to a preset rule. The distribution of the welding areas around the evaporation effective areas of (Continued)

the mask units at the edge of the mask sheet is consistent with the distribution of the welding areas around the evaporation effective areas of the mask units located in the inner region of the mask sheet.

5 Claims, 1 Drawing Sheet

(56)   References Cited

FOREIGN PATENT DOCUMENTS

| | | |
|---|---|---|
| CN | 104846328 A | 8/2015 |
| CN | 106086785 A | 11/2016 |
| CN | 107641786 A | 1/2018 |
| JP | 2005-005070 A | 1/2005 |
| JP | 2006-188746 A | 7/2006 |
| JP | 2015-010263 A | 1/2015 |
| JP | 6090009 B2 | 3/2017 |
| KR | 20150096590 A | 8/2015 |
| WO | WO-2018/019045 A1 | 2/2018 |

OTHER PUBLICATIONS

International Search Report and Written Opinion dated Sep. 6, 2018, from application No. PCT/CN2018/093329.

* cited by examiner

MASK SHEET AND METHOD FOR MANUFACTURING THE SAME

CROSS REFERENCE

The present application is based upon International Application No. PCT/CN2018/093329, filed on Jun. 28, 2018, which is based upon and claims priority to Chinese Patent Application No. 201710890369.8, filed on Sep. 27, 2017, and the entire contents thereof are incorporated herein by reference.

TECHNICAL FIELD

The present disclosure relates to the display technologies, and particularly, to a mask sheet and a method for manufacturing the same.

BACKGROUND

With the development of optical and semiconductor technologies, flat panel displays such as Liquid Crystal Displays (LCDs) and Organic Light Emitting Diode (OLEDs) have dominated in the display field due to their advantages such as light weight and small size, low energy consumption, fast response speed, high color purity, high contrast ratio and so on. In the semiconductor manufacturing processes, the lithography process is a very important, and it mainly functions to copy the pattern of a mask sheet onto a silicon wafer, so as to make preparation for subsequent etching or ion implantation processes.

The mask manufacturing process, such as the Fine Metal Mask (FMM) mode in the related art, is to evaporate an OLED material on a low temperature poly-silicon (LTPS) backplane according to a predetermined procedure, that is, an OLED material which for example emit red light, green light, blue light or the like is evaporated to a predetermined position by using a pattern on the FMM.

It should be noted that the information disclosed in the background section is only for facilitating understanding of the background of the present disclosure, and thus may include information that does not constitute prior art known to those of ordinary skill in the art.

SUMMARY

Arrangements of the present disclosure provide a mask sheet and a method for manufacturing the same.

According to an aspect, there is provided a mask sheet. The mask sheet includes a plurality of mask units. Each of the plurality of mask units includes an evaporation effective area and a plurality of welding areas that are distributed around the evaporation effective area according to a preset rule.

A distribution of the welding areas around evaporation effective areas of mask units that are located at an edge of the mask sheet is consistent with a distribution of the welding areas around evaporation effective areas of mask units that are located in an inner region of the mask sheet.

In an exemplary arrangement of the present disclosure, a plurality of evaporation effective areas are arranged in an array and the plurality of mask units are arranged in an array corresponding to the plurality of evaporation effective areas.

In an exemplary arrangement of the present disclosure, the plurality of mask units have consistent shapes and areas.

In an exemplary arrangement of the present disclosure, the array of the mask units includes a plurality of columns, and distribution of welding areas around evaporation effective areas of mask units that are located at the beginning and the end of each column is consistent with distribution of welding areas around evaporation effective areas of masks that are located at an inside part of each column; and/or the array of the mask units includes a plurality of rows, and distribution of welding areas around evaporation effective areas of mask units that are located at the beginning and the end of each row is consistent with distribution of welding areas around evaporation effective areas of masks that are located at an inside part of each row.

In an exemplary arrangement of the present disclosure, the evaporation effective areas have a shape selected from one or more of circle, ellipse and rectangle.

In an exemplary arrangement of the present disclosure, the mask units have a shape of rectangle.

In an exemplary arrangement of the present disclosure, the plurality of welding areas includes welding areas disposed at four corners of each of the plurality of mask units.

In an exemplary arrangement of the present disclosure, a virtual mask unit area is disposed at an outer side of mask units that are located at the beginning and the end of each column. The outer side is a side away from an inside part of each column. The plurality of welding areas further includes welding areas disposed at two adjacent corners of the virtual mask unit area that are close to the mask units at the beginning and the end of each column. A virtual mask unit area is disposed at an outer side of mask units that are located at the beginning and the end of each row. The outer side is a side away from an inside part of each row. The plurality of welding areas further includes welding areas disposed at two adjacent corners of the virtual mask unit area that are close to the mask units at the beginning and the end of each row.

In an exemplary arrangement of the present disclosure, the mask sheet includes a fine metal mask sheet.

According to another aspect, there is provided a method for manufacturing a mask sheet. The method includes forming a plurality of mask units, each of which includes an evaporation effective area. The method includes forming a plurality of welding areas around the evaporation effective area according to a preset rule. A distribution of the welding areas around the evaporation effective area of mask units that are located at an edge of the mask sheet is consistent with a distribution of the welding areas around the evaporation effective area of mask units that are located in an inner region of the mask sheet.

Other features and improvements of the present disclosure will be discussed in the following detailed description, or will be acquired partially by practicing the present disclosure.

It is appreciated that the above general description and the following detailed description are intended to be illustrative and exemplary, but not restrictive.

BRIEF DESCRIPTION OF THE DRAWINGS

The accompanying drawings, which are incorporated in the specification and constitute a part of the specification, illustrate arrangements in consistent with the present disclosure, and is used to explain the principle of the present disclosure together with the specification. It is apparent that the drawings in the following description are only some of the arrangements of the present disclosure, and other drawings may be obtained from these drawings by those skilled in the art without payment of any creative labor.

DETAILED DESCRIPTION

Example arrangements will now be described more fully with reference to the accompanying drawings. However, the example arrangements can be embodied in a variety of forms and should not be construed as being limited to the examples set forth herein; rather, these arrangements are provided so that the present disclosure will be more comprehensive and complete, and the conception of the example arrangements will be conveyed to those skilled in the art fully. The described features, structures, or characteristics may be combined in one or more arrangements in any suitable manner. In the following description, numerous specific details are set forth to facilitate understanding of arrangements of the present disclosure. However, one skilled in the art will appreciate that the technical solutions of the present disclosure may be implemented when one or more of the specific details are omitted, or other methods, components, devices, steps, and the like may be employed. In other instances, the well-known technical solutions would not be shown or described in detail so as to avoid various aspects of the present disclosure to be obscured.

Although the relative terms such as "upper" and "lower" are used in the specification to describe the relative relationship of one component in a figure to another component, these terms are used in this specification for convenience only, for example, according to a direction as described in the examples of the accompanying drawings. It will be understood that if a device in a figure is flipped upside down, an upper component described above will become a "lower" component. When a structure is referred to as being "on" another structure, it is possible that the structure is integrally formed on the another structure, or that the structure is "directly" disposed on the another structure, or that the structure is "indirectly" disposed the another structure through other structure(s).

The terms "a", "an", "the" and "said" mean the presence of one or more elements/components, or the like; the terms "including" and "having" should be understood in an open sense and means that there may be additional elements/components in addition to the listed elements/components. The terms "first", "second" and the like are used to distinguish different objects but not for limiting the number of objects.

During mask manufacturing processes, wrinkles may occur on a surface of a FMM sheet after the FMM sheet is stretched, which will affect the flat state of the evaporation effective area, thus affecting the quality of the evaporated product.

Therefore, it is necessary to develop a mask sheet and a method for manufacturing the same to improve the wrinkles of the mask sheet after the mask sheet is stretched, thus improving the quality of the evaporated product.

Figure 1:
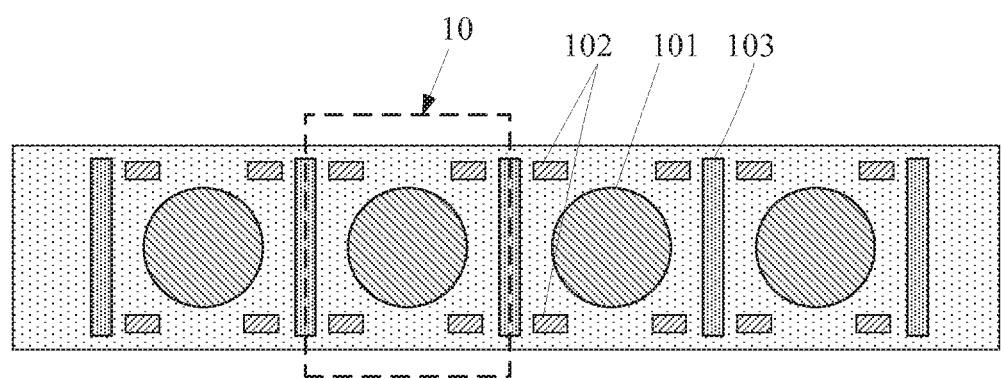
FIG. 1 schematically shows a schematic diagram illustrating a distribution of welding areas that are optimized aiming at wrinkles on effective areas of an FFM sheet according to an exemplary arrangement of the present disclosure.
Figure 2:
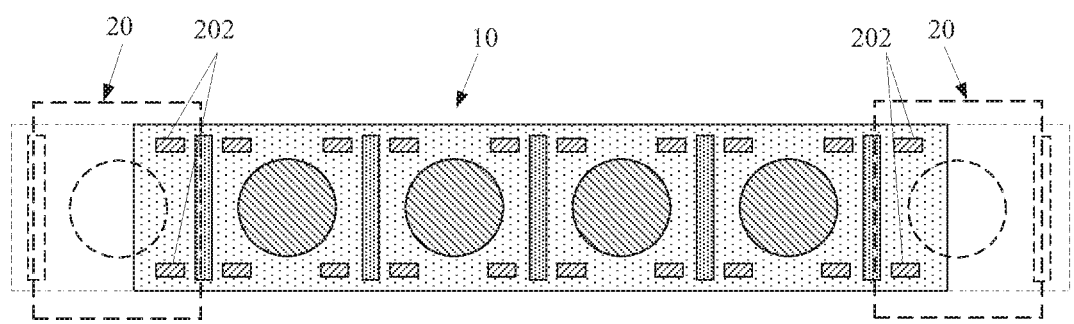
FIG. 2 schematically shows a schematic diagram illustrating a distribution of welding areas that are further optimized aiming at wrinkles on effective areas at the edge of the FFM sheet in FIG. 1 according to an exemplary arrangement of the present disclosure.

FIG. 1 shows a schematic diagram of a mask sheet according to an exemplary arrangement of the present disclosure, which schematically illustrates a distribution of welding areas that are optimized aiming at wrinkles on effective areas of an FFM sheet; FIG. 2 schematically shows a schematic diagram illustrating a distribution of welding areas that are further optimized aiming at wrinkles on effective areas at the edge of the FFM sheet in FIG. 1 according to an exemplary arrangement of the present disclosure.

There is proposed a mask sheet in the exemplary arrangement. Referring to FIGS. 1 and 2, the mask sheet includes a plurality of mask units 10. Each mask unit 10 may include an evaporation effective area 101 and a plurality of welding areas 102 that are distributed around the evaporation effective area according to a preset rule. The distribution of the welding areas around evaporation effective areas 101 of mask units 10 which are located at an edge of the mask sheet is consistent with distribution of the welding areas around evaporation effective areas 101 of mask units 10 which are located in an inner region of the mask sheet. The inner region of the mask sheet here may refer to a region of the mask sheet which is closer to the center of the mask sheet than the edge of the mask sheet. The inner region of the mask sheet may include the center of the mask sheet.

The mask sheet provided by the present disclosure includes a plurality of mask units. The mask sheet provided by the present disclosure may realize wrinkle removal for the evaporation effective areas inside the mask sheet by disposing welding areas around the evaporation effective areas inside mask unit; on the other hand, the mask sheet may optimize the welding areas around the evaporation effective areas at the edge such that the distribution of the welding areas around the evaporation effective areas at the edge of the mask sheet is consistent with the distribution of the welding areas around the evaporation effective areas in the inner region of the mask sheet. In this way, the force applied around the evaporation effective areas at the edge of the mask sheet is consistent with the force applied around the evaporation effective areas in the inner region of the mask sheet. Thus, the wrinkles occurring at the evaporation effective areas at the edge can be improved, which thus improves the wrinkles on the entire FMM Sheet and the flat state of the mask surface. As a consequence, the quality of the evaporated product is improved, which in turn increases the yield of the evaporated product.

Hereinafter, the mask sheet of the present exemplary arrangement will be described in further details.

In the exemplary arrangement, as shown in FIG. 1, the mask sheet may have a plurality of mask units 10, and each mask unit 10 may include an evaporation effective area 101 and a plurality of welding areas 102. The plurality of welding areas 102 are distributed around the evaporation effective area 101 according to a preset rule. In addition, the evaporation effective areas 101 may be arranged in an array and each evaporation effective area 101 may correspond to a display area on a display substrate. The array for example, may include a plurality of columns or a plurality of rows, or both. Moreover, the plurality of evaporation effective areas 101 may have consistent or the same shapes and areas, for example, the shapes of the plurality of evaporation effective areas 101 may be selected from one or more of circle, ellipse and rectangle. In other arrangement, the number, the arrangement, the shapes, and the sizes of the evaporation effective areas are not limited to the examples described above, and arrangements of the present disclosure do not impose specific limitations on this.

In the exemplary arrangement, the mask units 10 may be arranged in an array and may correspond to the evaporation effective areas 101 respectively, for example, the array may include a plurality of columns or a plurality of rows, or both. In addition, the mask units 10 may have consistent or the same shapes and areas, for example, the shape of each mask unit 10 may be rectangle.

For example, a plurality of evaporation effective areas 101 arranged in an array may be disposed on the mask sheet, and the evaporation effective areas 101 may have a circular shape with the same areas. A plurality of mask units 10 arranged in an array may be disposed, and each of the mask units 10 may be corresponding to a respect one of the evaporation effective areas. The mask units 10 may have a rectangle shape with the same areas. As shown in FIGS. 1 and 2, for example, the mask sheet has a mask unit array, the mask unit array includes a plurality of rows, and FIGS. 1 and 2 shows one of the rows. A region of a mask unit 10 may include an evaporation effective area 101, welding areas 102 and a redundant area 103.

During manufacture, wrinkles may occur on the evaporation effective area 101 while the FMM sheet is stretched. In the arrangement, this problem can be addressed by disposing welding areas. As shown in FIG. 1, four welding areas 102 may be disposed around the evaporation effective area 101. In other arrangements, more than four welding areas 102 may be disposed around the evaporation effective area 101.

In the above region of the mask unit 10, the welding areas 102 may be disposed at the four corners of the evaporation effective area 101; however, it has been found through practice that disposing of the welding areas 102 has a significant improvement on the wrinkles that occur on the evaporation effective areas 101 of the mask units located in the inside of an entire row of the FMM sheet, while has no improvement on the wrinkles that occur on the evaporation effective areas 101 of the mask units located at the beginning and the end of the row. Even by changing variables such as energy (transition between high energy and low energy), pitch (adjustment of the spacing between two dots and spacing between dots of multiple rows) and the number of dots (adjustment from one row of dots to multiple rows of dots or from multiple rows of dots to one row of dots), the wrinkles that occur on the evaporation effective areas 101 of the mask units located at the beginning and the end of the row still exist. This affects the flat state of the mask surface and as a result affects the quality of the evaporated product.

There is proposed a method for disposing welding areas, so as to address the wrinkles occurring on evaporation effective areas 101 of mask units located at the edge of a FMM sheet. The method may have the distribution of the welding areas 102 around the mask units 10 at the edge of the FMM sheet be consistent with the distribution of the welding areas 102 around the mask units 10 in the inner region of the FMM sheet, and in this way, the force applied around the mask units 10 at the edge of the FMM sheet is consistent with the force applied around the mask units 10 in the inner region of the FMM sheet. Further, as shown in FIG. 2, the distribution of the welding areas 102 around the mask units 10 at the edge (i.e., at the beginning and the end) of the mask sheet may be consistent with the distribution of the welding areas 102 around the mask units located in the inner region of the mask sheet.

For example, as shown in FIG. 1, there are eight welding areas 102 around the mask unit 10 (as indicated by the dotted box) that are located in the inner region of the mask sheet (i.e., four welding areas around the mask unit 10 as indicated by the dotted box, and two welding areas that are disposed at the two corners of the left-adjacent mask unit close to the mask unit 10 and two welding areas that are disposed at the two corners of the right-adjacent mask unit close to the mask unit 10). There are six welding areas 102 around the mask unit 10 that is located at the edge (i.e., the mask unit 10 at the beginning or the end of the row), i.e., four welding areas 102 around the mask unit 10 at the beginning or the end of the row and two welding areas 102 that are disposed at the two corners of one adjacent mask unit close to the mask unit 10 at the beginning or the end of the row.

It is assumed that a virtual mask unit area 20 is disposed at an outer side of the mask unit that are located at the edge (i.e., the beginning or the end) of the row, and this outer side refers to a side far away from the inner region (e.g., the middle) of this row. As shown in FIG. 2, there are provided with two welding areas 202 at the two adjacent corners of the mask units 10 that are located at the beginning and the end of this row in the corresponding virtual mask unit area 20, and the number of the welding areas 102 around the mask unit 10 at the edge (i.e., at the beginning or the end) is added from six up to eight by addition of these two welding areas 202, that is to say, the number of welding areas 102 around the mask unit 10 at the edge is same as the number of welding areas 102 around the mask unit 10 in the inner region of the mask sheet, i.e., 8 welding areas. In addition, the positions of welding areas 102 around the mask unit 10 at the edge corresponds to or is the same as the positions of welding areas 102 around the mask unit 10 at the inner region of the row. As a result, the force applied around the two mask units 10 at the beginning and the end of this row is consistent with the force applied around the mask units 10 at the inner region of this row, which in turn address the wrinkles occurring on the effective areas 101 of the mask units 10 at the edge (i.e., at the beginning and the end) of this row and the flat state of the mask surface is improved, thus improving the yield and quality of evaporated product.

In other arrangements, it is possible to optimize arrangement of evaporation effective areas of the mask units 10 at the edge (i.e., at the beginning or the end of the row or column) in a form of columns or a form of columns and rows, and all designs where the distribution of the welding areas 102 around the mask units 10 at the edge is consistent with the distribution of the welding areas 102 around the mask unit 10 at the inner region of the mask sheet falls into the scope of the present disclosure.

There is provided a method for manufacturing a mask sheet in arrangements of the present disclosure and this method may include the following.

A plurality of mask units 10 are formed and each mask unit 10 includes an evaporation effective area 101.

A plurality of welding areas 102 are formed around the evaporation effective area 101 according to a preset rule. The distribution of the welding areas 102 around evaporation effective areas 101 of mask units 10 which are located at an edge of the mask sheet is consistent with distribution of the welding areas 102 around evaporation effective areas 101 of mask units 10 which are located in an inner region of the mask sheet.

All specific features regarding the above method have been described in the above arrangements of the mask sheet and thus details will be omitted here.

In addition, although the various blocks of the method of the present disclosure are described in a particular order in the drawings, it is not required or implied that the blocks should be performed in this specific order, or that all the blocks shown should be performed to achieve the desired result. Additionally or alternatively, some blocks may be omitted, or multiple blocks may be combined into one block for execution, and/or one block may be decomposed into multiple blocks for execution.

Other arrangements of the present disclosure will be apparent to those skilled in the art when considering the specification and practicing the disclosure herein. The present application is intended to cover any variations, uses, or adaptations of the present disclosure, which are in accordance with the general principles of the present disclosure and include common knowledge or customary means in the art that are not disclosed in the present disclosure. The specification and examples are intended to be regarded as illustrative only, and the turn scope and spirit are defined by the accompanying claims.

What is claimed is:

1. A mask sheet comprising a plurality of mask units, wherein each of the plurality of mask units comprises an evaporation effective area and a plurality of welding areas that are distributed around the evaporation effective area according to a preset rule, wherein a plurality of evaporation effective areas are arranged in an array and the plurality of mask units are arranged in an array corresponding to the plurality of evaporation effective areas, the plurality of mask units have similar shapes and areas, the mask units have a shape of rectangle, and the plurality of welding areas comprise welding areas disposed at four corners of each of the plurality of mask units, and wherein: a virtual mask unit area is disposed at an outer side of mask units that are located at beginning and end of each column, the outer side is a side away from an inside part of each column, and the plurality of welding areas further comprise welding areas disposed at two adjacent corners of the virtual mask unit area that are close to the mask units at the beginning and the end of each column; and/or a virtual mask unit area is disposed at an outer side of mask units that are located at the beginning and end of each row, the outer side is a side away from an inside part of each row, and the plurality of welding areas further comprise welding areas disposed at two adjacent corners of the virtual mask unit area that are close to the mask units at the beginning and the end of each row.

2. The mask sheet according to claim 1, wherein the evaporation effective areas have a shape selected from one or more of circle, ellipse and rectangle.

3. The mask sheet according to claim 1, wherein the mask sheet comprises a fine metal mask sheet.

4. The mask sheet according to claim 1, wherein a number of the welding areas around the mask units located at the beginning and the end of each column is identical to a number of the welding areas around the evaporation effective areas of the mask units located at the inner of the mask sheet; and/or number of the welding areas around the mask units located at the beginning and the end of each row is identical to a number of the welding areas around the evaporation effective areas of the mask units located in an inner region of the mask sheet.

5. A method for manufacturing a mask sheet, comprising:

forming a plurality of mask units, each of which comprises an evaporation effective area; and forming a plurality of welding areas around the evaporation effective area according to a preset rule wherein a plurality of evaporation effective areas are arranged in an array and the plurality of mask units are arranged in an array corresponding to the plurality of evaporation effective areas the plurality of mask units have similar shapes and areas, the mask units have a shape of rectangle, and the plurality of welding areas comprise welding areas disposed at four corners of each of the plurality of mask units, and wherein: a virtual mask unit area is disposed at an outer side of mask units that are located at beginning and end of each column, the outer side is a side away from an inside part of each column, and the plurality of welding areas further comprise welding areas disposed at two adjacent corners of the virtual mask unit area that are close to the mask units at the beginning and the end of each column; and/or a virtual mask unit area is disposed at an outer side of mask units that are located at the beginning and end of each row, the outer side is a side away from an inside part of each row, and the plurality of welding areas further comprise welding areas disposed at two adjacent corners of the virtual mask unit area that are close to the mask units at the beginning and the end of each row.

* * * * *